US010491246B2

United States Patent
Yang et al.

(10) Patent No.: US 10,491,246 B2
(45) Date of Patent: Nov. 26, 2019

(54) SOFT DECISION DECODING METHOD AND SYSTEM THEREOF

(71) Applicant: Harman International Industries, Incorporated, Stamford, CT (US)

(72) Inventors: Zeng Yang, Shanghai (CN); Qingshan Zhang, Shanghai (CN); Guoxia Zhang, Shanghai (CN)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 216 days.

(21) Appl. No.: 14/909,589

(22) PCT Filed: Jul. 31, 2014

(86) PCT No.: PCT/CN2014/083394
§ 371 (c)(1),
(2) Date: Feb. 2, 2016

(87) PCT Pub. No.: WO2015/027785
PCT Pub. Date: Mar. 5, 2015

(65) Prior Publication Data
US 2016/0182093 A1   Jun. 23, 2016

(30) Foreign Application Priority Data

Aug. 29, 2013 (WO) ............... PCT/CN2013/082533

(51) Int. Cl.
*H03M 13/45* (2006.01)
*H04L 29/06* (2006.01)
(Continued)

(52) U.S. Cl.
CPC ....... *H03M 13/45* (2013.01); *H03M 13/3994* (2013.01); *H03M 13/4138* (2013.01);
(Continued)

(58) Field of Classification Search
None
See application file for complete search history.

(56) References Cited

U.S. PATENT DOCUMENTS 6,768,721 B1   7/2004   Schmitz et al.
6,950,976 B1   9/2005   Garrabrant et al.
(Continued)

FOREIGN PATENT DOCUMENTS

CN   1328384 A   12/2001
CN   102055554 A   5/2011
(Continued)

OTHER PUBLICATIONS

Biddlestone et al.: "A GNU Radio based testbed implementation with IEEE 1609 WAVE functionality", Proc. IEEE Vehicular Networking Conference 2009 (VNC 2009), IEEE, Piscataway, NJ, Oct. 28, 2009, pp. 1-7, XP031630272, ISBN: 978-1-4244-5685-7.
(Continued)

*Primary Examiner* — Justin R Knapp
(74) *Attorney, Agent, or Firm* — Artegis Law Group, LLP

(57) ABSTRACT

Method and system for soft decision decoding are provided. A soft decision decoding method implemented by a receiver in a communication network may include: receiving a signal frame carrying a message through a communication network; obtaining data structure of the message; obtaining at least one bit of the message based on the data structure and known information; and decoding the received signal frame based on the at least one bit using soft decision decoding to obtain a decoding result. Decoding efficiency and accuracy may be improved.

20 Claims, 5 Drawing Sheets

(51) Int. Cl.
*H04L 1/00* (2006.01)
*H03M 13/00* (2006.01)
*H03M 13/39* (2006.01)
*H03M 13/41* (2006.01)

(52) U.S. Cl.
CPC ......... *H03M 13/6527* (2013.01); *H04L 1/00* (2013.01); *H04L 1/0045* (2013.01); *H04L 69/22* (2013.01)

(56) References Cited

U.S. PATENT DOCUMENTS

| | | | |
|---|---|---|---|
| 7,447,281 B2* | 11/2008 | Aue | H04L 1/0054 375/341 |
| 8,155,247 B2* | 4/2012 | Koorapaty | H03M 13/3769 375/341 |
| 8,238,318 B1* | 8/2012 | Negus | H04W 84/12 370/310 |
| 8,314,736 B2* | 11/2012 | Moshfeghi | G01S 5/0236 342/465 |
| 8,761,285 B2* | 6/2014 | Addepalli | H04L 27/345 375/261 |
| 2006/0218459 A1* | 9/2006 | Hedberg | H03M 13/1102 714/752 |
| 2007/0230630 A1 | 10/2007 | Tran | |
| 2008/0232490 A1 | 9/2008 | Gross et al. | |
| 2009/0041166 A1 | 2/2009 | Patel et al. | |
| 2009/0177951 A1 | 7/2009 | Lee et al. | |
| 2009/0316823 A1 | 12/2009 | Lee et al. | |
| 2011/0222408 A1 | 9/2011 | Kasslin et al. | |
| 2012/0016553 A1 | 1/2012 | Bai | |
| 2012/0134362 A1 | 5/2012 | Itagaki et al. | |
| 2012/0140835 A1* | 6/2012 | Czink | H04L 25/0226 375/260 |
| 2016/0227490 A1* | 8/2016 | Yang | H04W 52/281 |

FOREIGN PATENT DOCUMENTS

| | | |
|---|---|---|
| EP | 2337227 A1 | 6/2011 |
| WO | 2007/021224 A1 | 2/2007 |

OTHER PUBLICATIONS

Extended European Search Report for Application No. 14839601.3 dated Mar. 30, 2017.
International Search Report dated Oct. 30, 2014 in Application No. PCT/CN2014/083394.
"IEEE Standard for Information technology-Telecommunications and information exchange between systems—Local and metropolitan area networks—Specific requirements—Part 11: Wireless LAN Medium Access Control (MAC) and Physical Layer (PHY)", International Standard, Nov. 1, 2012, IEEE Standard, XP055601909, pp. 1583-1619.
Kenney et al., "Dedicated Short-Range Communications (DSRC) Standards in the United States", Proceedings of the IEEE, New York, US, vol. 99, No. 7, Jul. 1, 2011, pp. 1162-1182.

* cited by examiner

```
BasicSafetyMessage ::= SEQUENCE {
  -- Header items
  msgID    DSRCmsgID,           -- 1 byte -- Part I, sent as a single octet blob
  blob1    BSMblob, --
  -- The blob consists of the following 37 packed bytes:
  --
  -- msgCnt    MsgCount,         -x- 1 byte
  -- id        TemporaryID,      -x- 4 bytes
  -- secMark   DSecond,          -x- 2 bytes -- pos    PositionLocal3D,
    -- lat       Latitude,          -x- 4 bytes
    -- long      Longitude,         -x- 4 bytes
    -- elev      Elevation,         -x- 2 bytes
    -- accuracy  PositionalAccuracy, -x- 4 bytes -- motion   Motion,
    -- speed    Speed,              -x- 2 bytes
    -- heading  Heading,            -x- 2 byte
    -- accelSet AccelerationSet4Way, -x- 7 bytes -- control  Control,
    -- brakes   BrakeSystemStatus,  -x- 2 bytes -- basic   VehicleBasic,
    -- size    VehicleSize,          -x- 3 bytes

... -- # LOCAL_CONTENT
}
```

FIG. 3

SOFT DECISION DECODING METHOD AND SYSTEM THEREOF

CROSS-REFERENCE TO RELATED APPLICATIONS

The present application is a national stage application of the international application titled, "SOFT DECISION DECODING METHOD AND SYSTEM THEREOF," filed on Jul. 31, 2014 and having application number PCT/CN2014/083394. This international application claims priority to the PCT patent application titled, "SOFT DECISION DECODING METHOD AND SYSTEM THEREOF," filed on Aug. 29, 2013 and having application number PCT/CN2013/082533. The subject matter of these related applications is hereby incorporated herein by reference.

TECHNICAL FIELD

The present disclosure generally relates to soft decision decoding of a signal frame received in a communication network.

BACKGROUND

In communication systems, soft decision decoding methods are widely used at a receiver side to decode a bit sequence which is encoded at a transmitter side, thereby obtaining information from the transmitter side. Due to channel fading, shadowing, interferences and the like, error rates of conventional soft decision decoding methods may be high.

SUMMARY

Inventors found that some bits of a message sent from a transmitter to a receiver may be already known to the receiver. Using these known bits to perform soft decision decoding can improve decoding efficiency and reduce error rate.

In one embodiment, a soft decision decoding method implemented by a receiver is provided. The method may include: receiving a signal frame carrying a message through a communication network; obtaining data structure of the message; obtaining at least one bit of the message based on the data structure and known information; and decoding the received signal frame based on the at least one bit using soft decision decoding to obtain a decoding result.

In some embodiments, the message may contain the known information.

In some embodiments, the at least one bit may be distributed substantially evenly in the received signal frame.

In some embodiments, the data structure may be obtained based on the length of the signal frame. In some communication networks, such as a vehicle safety communication (VSC) network, there are only a few types of messages. Based on the length of the signal frame, the message type may be determined, thus the data structure may be obtained.

In some embodiments, the data structure of the message may be obtained based on control information of the message. The control information may indicate some basic information of the message, which may be used to determine the data structure of the message.

In some embodiments, if the communication network is an IEEE 802.11p network, obtaining the data structure of the message may include: obtaining a physical layer convergence protocol (PLCP) header corresponding to the message; determining which type of message the message is based on control information of the message contained in the PLCP header; and obtaining the data structure of the message based on the determined message type. In the IEEE 802.11p network, the control information of the message may be contained in the PLCP header, and the signal frame may carry the PLCP header and the message. The PLCP header may be decoded prior to the message. Therefore, the data structure may be obtained before decoding of the message. In some embodiments, which type of message the message is may be determined based on payload length information in the PLCP header.

In some embodiments, determining the message type may include: determining whether the PLCP header includes information directly indicating the message type; and if yes, determining the message type based on the information directly indicating the message type.

In some embodiments, a bit in a "Reserved" field of the PLCP header may be used to indicate whether or not the PLCP header includes the information directly indicating the message type, last few bits in a "RATE" field and/or a "LENGTH" field may be used to directly indicate the message type. In some embodiments, if a value of the "Reserved" field indicates that the PLCP header includes information directly indicating the message type, which type the message is may be determined based on a value of the "Rate" field.

In some embodiments, if the data structure of the message indicates that the message is a basic safety message (BSM), the at least one bit may include positioning data of the receiver. The BSM may include positioning data of a transmitter which sent the signal frame. Since the effective range of vehicular communication may be short, for example within about 300 meters, first few digits of the positioning data, such as latitude and longitude position, of the transmitter and the receiver may be the same. Therefore, the at least one bit may represent the first few digits of the positioning data of the receiver, and may equal to some corresponding bits in the message which represent corresponding first few digits of the positioning data of the transmitter. In some embodiments, the at least one bit may include bits representing the first few digits of the positioning data, sub-network access protocol (SNAP) header data and logical link control (LLC) header date in a medium access control (MAC) layer of the receiver, and any combination thereof. According to IEEE 802.11p, the SNAP header data and the LLC header data may be set as default values, which means they are known to the receiver.

In some embodiments, decoding the received signal frame based on the at least one bit using soft decision decoding may include: generating a priori sequence which includes N likelihood ratios each of which corresponds to one bit of the message, where likelihood ratios corresponding to the at least one bit may be set according to the at least one bit; and decoding the received signal frame based on the priori sequence using soft decision decoding.

In some embodiments, the priori sequence may be a log likelihood ratio (LLR) sequence.

In some embodiments, the method may further include transmitting the decoding result to an application layer even if the decoding result includes an error. Each bit of the decoding result may represent a probability of the corresponding bit being "1" or "0". Therefore, threshold values may be set to pick up some bits having high probabilities of being "1" or "0", and these bits may be used in the application layer.

In one embodiment, a soft decision decoding system in a receiver is provided. The system may include a transceiver configured to receive a signal frame carrying a message through a communication network. The system may further include a processing device configured to: obtain data structure of the message; obtain at least one bit of the message based on the data structure and known information; and decode the received signal frame based on the at least one bit using soft decision decoding to obtain a decoding result.

In some embodiments, the message may contain the known information.

In some embodiments, the at least one bit may be distributed substantially evenly in the received signal frame.

In some embodiments, the processing device may be configured to obtain the data structure based on the length of the signal frame.

In some embodiments, the processing device may be configured to obtained the data structure based on control information of the message.

In some embodiments, if the communication network is an IEEE 802.11p network, the processing device may be configured to obtain the data structure by: obtaining a physical layer convergence protocol (PLCP) header corresponding to the message; determining which type of message the message is based on control information of the message contained in the PLCP header; and obtaining the data structure of the message based on the determined message type. In some embodiments, which type of message the message is may be determined based on payload length information in the PLCP header.

In some embodiments, the processing device may be configured to determine the message type by: determining whether the PLCP header includes information directly indicating the message type; and if yes, determining the message type based on the information directly indicating the message type. In some embodiments, the processing device may be configured to determine whether the PLCP header includes the information directly indicating the message type based on a value of a "Reserved" field of the PLCP header, and determine which type of message the message is based on a value of a "RATE" field and/or a "LENGTH" field if the value of the "Reserved" field indicate that the PLCP header includes the information directly indicating the message type.

In some embodiments, if the data structure of the message indicates that the message is a basic safety message (BSM), the at least one bit may include positioning data of the receiver. In some embodiments, the at least one bit may include bits representing first few digits of the positioning data of the receiver, sub-network access protocol (SNAP) header data and logical link control (LLC) header date in a medium access control (MAC) layer of the receiver, and any combination thereof.

In some embodiments, the processing device may be configured to decode the message based on a priori sequence which may include N likelihood ratios each of which corresponds one bit of the message using soft decision decoding, where likelihood ratios corresponding to the at least one bit may be set according to the at least one bit.

In some embodiments, the priori sequence may be a log likelihood ratio (LLR) sequence.

In some embodiments, the processing device may be further configured to send the decoding result to an application layer even if the decoding result includes an error.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 3 schematically illustrates contents of a BSM in ASN.1 (abstract syntax notion one) encoding;

DETAILED DESCRIPTION

Figure 1:
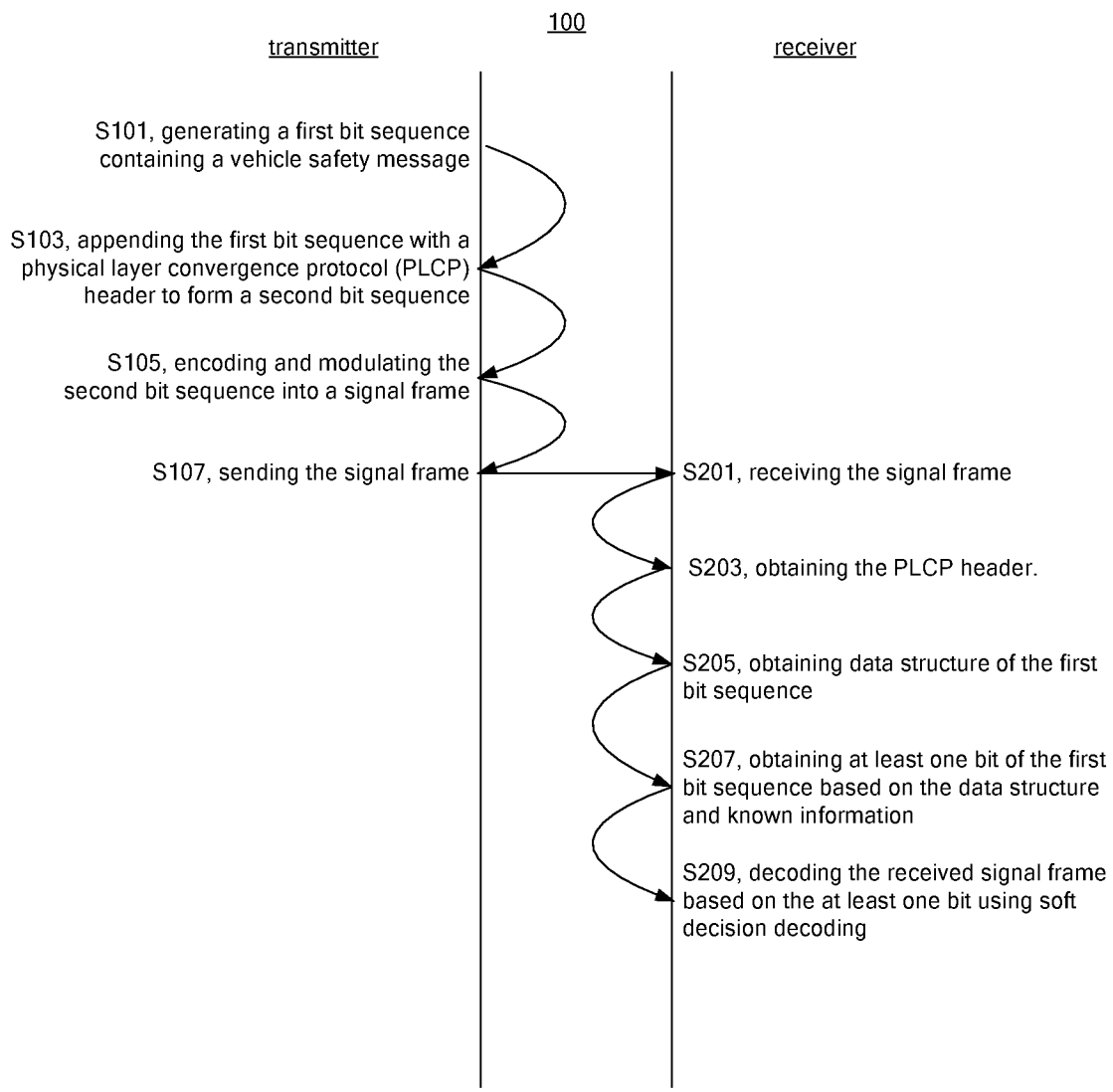
FIG. 1 schematically illustrates a flow chart of a method for communicating a vehicle safety message in a vehicle network according to one embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

FIG. 1 schematically illustrates a flow chart of a method 100 for communicating a vehicle safety message in a vehicle network according to one embodiment.

Standard IEEE 802.11p defines communication architectures for wireless access in vehicular environments (WAVE), especially for mechanisms in medium access control (MAC) layers and physical layers. Communications of messages in vehicle networks are compatible with IEEE 802.11p. However, conventional communication methods in vehicle networks may have high packet loss rates due to decoding failures, which is extremely unsatisfactory for vehicle safety messages. Hereunder, communication of a vehicle safety message in a vehicle network will be illustrated. Extensions to communications of other messages in other communication networks may be easily conceived.

In S101, generating a first bit sequence containing a vehicle safety message.

Vehicle safety messages may include various messages which may have different names and/or contents in different regions according to specific local agreements. For example, vehicles may send their basic state information using basic safety message (BSM) in USA. For additional collision avoidance applications, signal phase and timing (SPAT) messages and map data (MAP) messages may be sent to convey the signal state and geographical description of an intersection. While in Europe, cooperative awareness messages (CAM) and decentralized environmental notification messages (DENM) may be used.

Hereunder, communication of a BSM, which may happen most frequently in USA, will be illustrated as an example.

Figure 2:
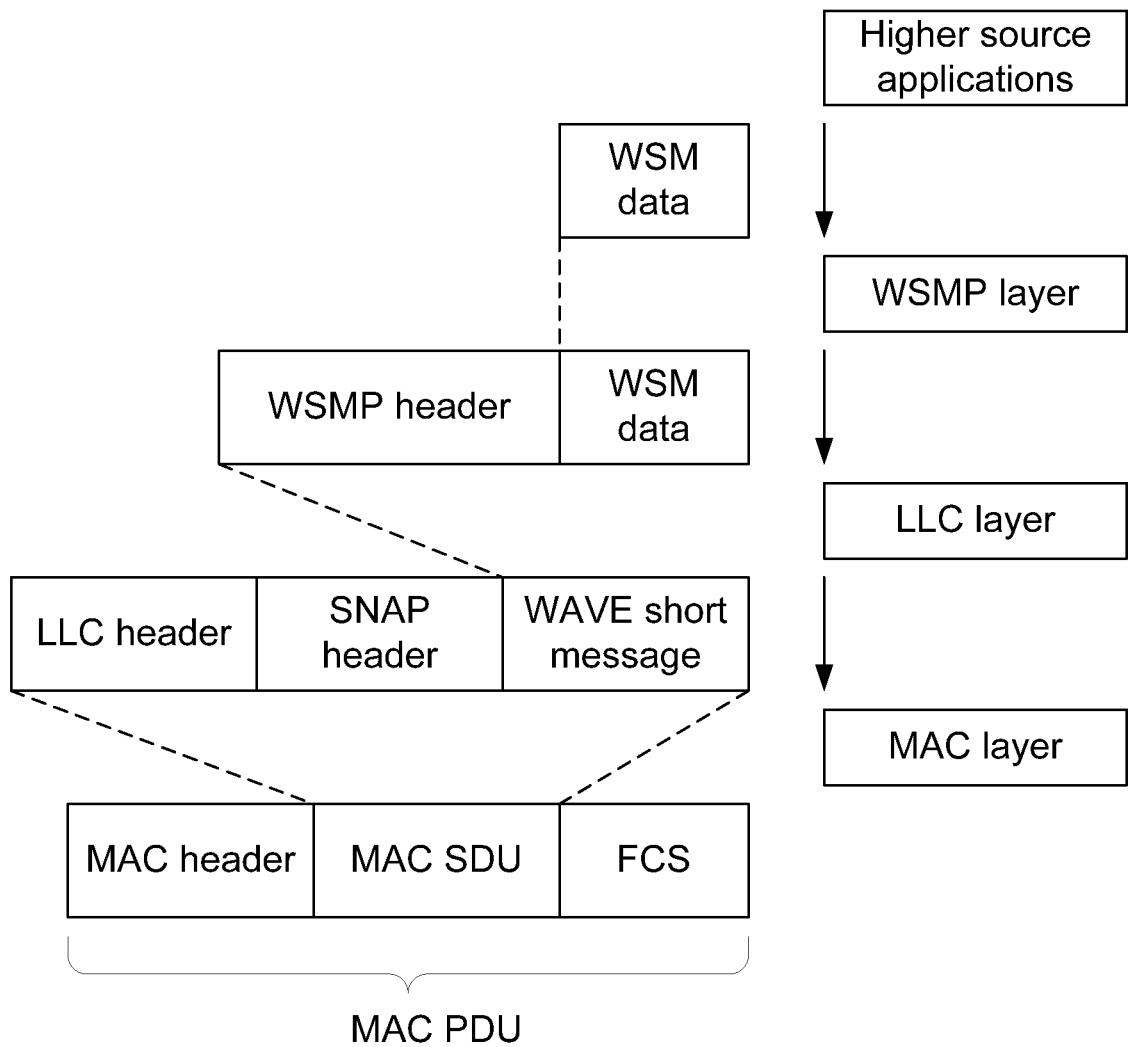
FIG. 2 schematically illustrates a process of generating a first bit sequence carrying a basic safety message (BSM)

FIG. 2 schematically illustrates a process of generating the first bit sequence containing the BSM. According to IEEE 802.11p, the BSM may be transmitted as WAVE short message (WSM) data using WAVE short message protocol (WSMP). Referring to FIG. 2, the BSM may be generated from applications in an application layer and carried in a "WSM data" field. Thereafter, the WSM data may pass through a WSMP layer, in which the WSM data is appended with a WSMP header to form a WAVE short message. The WAVE short message may reach a logic link control (LLC) layer, in which the WAVE short message may be appended with a sub-network access protocol (SNAP) header and a LLC header. The WAVE short message appended with the SNAP header and the LLC header is to be transmitted into a MAC layer, thus normally called as a MAC service data unit (MAC SDU). In the MAC layer, the MAC SDU may be appended with a MAC header to form the MAC protocol data unit (MAC PDU), such that the first bit sequence containing the BSM is formed. According to IEEE 802.11p, a frame check sequence (FCS) may be generated based on the MAC PDU and appended to it, which may be used in a following FCS check process.

Generating the MAC PDU is well known in the art and may not be described in detail here. The formed MAC PDU may be then sent to a physical layer to be encoded and modulated therein.

Inventors found that, in WAVE systems, at least one bit of the MAC PDU may be already known to potential receivers, which may facilitate subsequent decoding at the receiver side.

Firstly, some reserved fields and/or invariant fields in the MAC PDU may be set as default values in some occasions. For example, in collision avoidance applications, SNAP headers, LLC headers, etc., for BSM messages may have a fixed value according to the standard.

Secondly, the transmitter and the potential receivers may share some identical data in the "WSM data" field according to the message type. FIG. 3 schematically illustrates contents of a BSM in ASN.1 (abstract syntax notion one) encoding. As shown in FIG. 3, the BSM reserves 4 bytes, 4 bytes and 2 bytes respectively for representing latitude, longitude and elevation information of the transmitter. Since the effective range of vehicular communication may be short, normally within about 300 meters, it could be concluded that first few digits of the positioning data of the transmitter and the receiver may be the same.

The at least one bit of the MAC PDU can be used by the receiver to decode data packages sent by the transmitter, thereby improving the decoding rate, which will be illustrated subsequently.

In some embodiments, a first set of bits which may be known to the receiver may be selected and distributed in the MAC PDU according to a predetermined rule. For example, the first set of bits may be evenly distributed in the MAC PDU, for further benefiting the subsequent decoding. Distributing the first set of bits may be simply achieved using an interleaver.

In S103, appending the first bit sequence with a physical layer convergence protocol (PLCP) header to form a second bit sequence.

Figure 4:
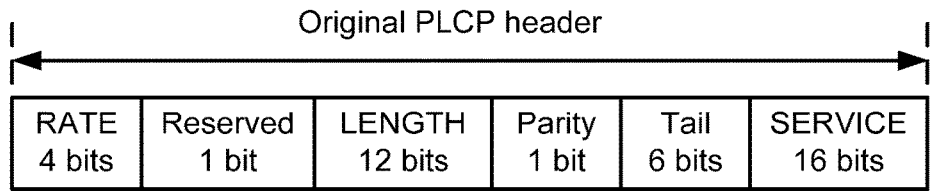
FIG. 4 illustrates a conventional structure of a physical layer convergence protocol (PLCP) header according to IEEE 802.11p.

The PLCP header may include control information of the first bit sequence, such as modulation type, encoding rate, payload length, etc. FIG. 4 illustrates a conventional structure of a PLCP header according to IEEE 802.11p. In the conventional PLCP header structure, a "RATE" field having 4 bits may represent the transmission rate, a "LENGTH" field having 12 bits may represent the payload length, and a 1 bit "Reserved" field is reserved for other applications. According to the standard, the current transmission rate for vehicle safety messages is confined to a few options. Therefore, some bits in the 4-bit "RATE" field may be spare. Further, safety related messages are relatively shorter in message size, so that the 12-bit "LENGTH" field may be a little wasteful for only representing the payload length. Therefore, some spare bits within the "RATE" field and the "LENGTH" field, and the 1 bit in the "Reserved" field may be used for other purposes.

As illustrated above, the first set of bits which are known to the receiver may change based on message types. Therefore, in some embodiments, the original PLCP header may be redefined to indicate the message type. If the receiver can obtain the redefined PLCP header, the message type may be identified, such that the receiver may obtain the first set of bits of the MAC PDU.

Figure 5:
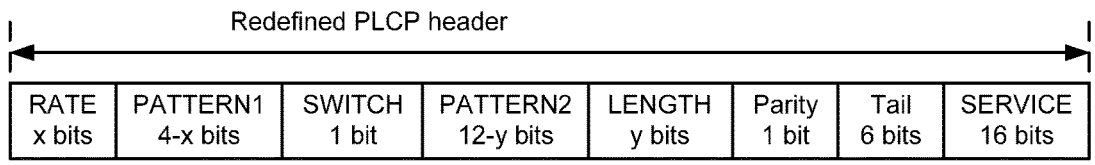
FIG. 5 illustrates a redefined physical layer convergence protocol (PLCP) header according to one embodiment.

FIG. 5 illustrates a redefined PLCP header according to one embodiment. As shown in FIG. 5, (4-x) bits (x<4, for example, 1 or 2) within the "RATE" field and (12-y) bits (y<12) within the "LENGTH" field may be used as a "PATTERN1" field and a "PATTERN2" field for representing the message type which indicates what kind of message the first bit sequence carries. The remained x bits within the "RATE" field and y bits within the "LENGTH" may be used for indicating the transmission rate and payload length, as they are originally defined. Further, the 1-bit in the "Reserved" field may be utilized as a "SWITCH" identifier indicating whether a message type field is included in the PLCP header. With this redefinition, the total length of the PLCP header remains unchanged compared with the conventional one, thereby still being compatible with the IEEE 802.11p standard.

In some embodiments, the PLCP header may further include, by using spare bits, a redistribution identifier for indicating whether the first set of bits are redistributed in the MAC PDU and how they are distributed.

It should be noted that redefining the PLCP header may be optional.

In S105, encoding and modulating the second bit sequence into a signal frame.

The second bit sequence containing the BSM needs to be encoded and modulated into digital symbols, for example, orthogonal frequency division multiplexing (OFDM) symbols, to increase data rate. Encoding and modulating the second bit sequence may be implemented by mechanisms in the physical layer, including scrambler, encoder, interleaver, mapper, OFDM symbol assembler, inverse fast Fourier transmitter (IFFT) and spectral shaping.

Figure 6:
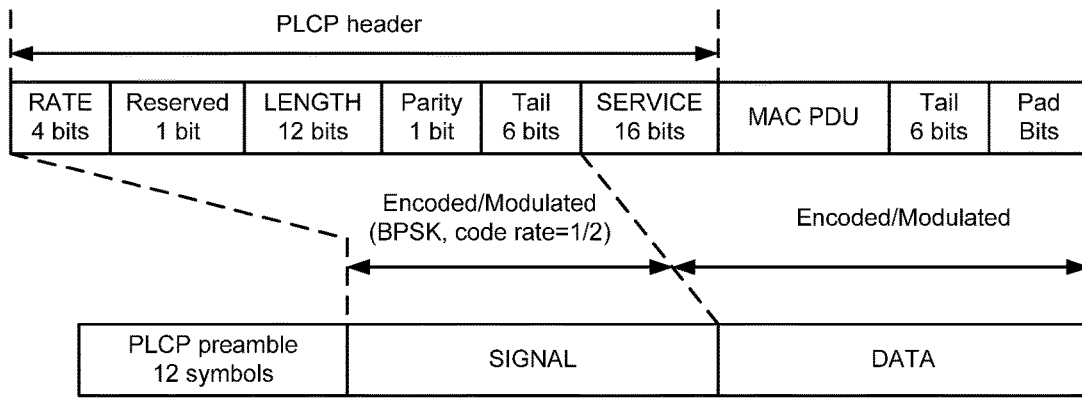
FIG. 6 schematically illustrates conversion from a second bit sequence to orthogonal frequency division multiplexing (OFDM) symbols.

FIG. 6 schematically illustrates conversion from the second bit sequence to the OFDM symbols. As shown in FIG. 6, the MAC PDU in the second bit sequence, together with a "SERVICE" field of the PLCP header, a "Tail" field and some pad bits, may be encoded and modulated into several OFDM symbols, constituting a "DATA" part. The PLCP header, except its "SERVICE" field, may be encoded and modulated into OFDM symbols, constituting a "SIGNAL"

part. According to IEEE 802.11p, modulation type and encoding rate of the PLCP header are confined to BPSK 1/2. Information of modulation type and encoding rate of the MAC PDU appended with the "SERVICE" field may be carried in the "SIGNAL" part as it is contained in the PLCP header. Further, a PLCP preamble with 12 symbols may be appended.

After digital-to-analogue conversion, the OFDM symbols may be converted into a signal frame ready to be sent out.

In S107, sending the signal frame.

The signal may be sent, for example, broadcasted, by a transceiver in the physical layer of the transmitter through the vehicle network.

Above described S101 to S107 are implemented at the transmitter side.

Following processing goes to a receiver side.

In S201, receiving the signal frame.

Receiving the signal frame may be implemented in a physical layer of the receiver. Theoretically, all neighboring vehicles within the effective range may receive the signal frame through the vehicle network. However, in practise, signal transmission may be blocked by obstacles. Besides, the received signal frame may be corrupted by noise and interference.

In S203, obtaining the PLCP header.

By analogue-to-digital conversion and synchronization, the signal frame may be converted into the digital symbols which include the "SIGNAL" part and the "DATA" part. The "SIGNAL" part may be then demodulated and decoded to obtain the PLCP header.

The PLCP header may include control information of the MAC PDU, which control information may be essential for subsequent decoding. In the vehicle network, correctly obtaining the PLCP header may be ensured by multiple iterations.

In S205, obtaining data structure of the first bit sequence.

The data structure may indicate the length, data field distribution, and the like of the first bit sequence, which is important for decoding the "DATA" part to obtain the first bit sequence.

The data structure may be corresponding to the message type of the message contained in first bit sequence. Therefore, the data structure may be obtained based on the message type.

In some embodiments, the decoded PLCP header may be checked to determine whether the PLCP header has been redefined to include the message type. Specifically, whether the "Reserved" field is used as a "SWITCH" identifier in the decoded PLCP header may be checked. If the check result is "yes", for example, the bit in the "Reserved" identifier is "1", the "PATTERN 1" and/or "PATTERN 2" fields should be checked to identify the message type. Based on the message type, the data structure of the first bit sequence may be obtained.

As described above, redefining the PLCP header may be optional, which means the decoded PLCP header may not include the message type information directly. Therefore, checking whether the PLCP header has been redefined may be optional. The message type may be estimated based on other information.

In some embodiments, which type of message the message contained in the first bit sequence is may be determined based on data in the "LENGTH" field. The "LENGTH" field may stand for the payload length. Since different types of messages transmitted in vehicle networks may have different corresponding payload lengths, respectively, the message type may be determined based on the data in the "LENGTH" field.

In some embodiments, the message type may be determined based on data in the "RATE" field and length of the "DATA" part of the digital symbols. The "RATE" field and length of the "DATA" part may also used to determine the length of the first bit sequence.

In some embodiments, the message type may be determined directly based on the length of the signal frame.

In some embodiments, the data structure may further include information of how the first set of bits being distributed in the first bit sequence, which information may be obtained based on the PLCP header.

In S207, obtaining at least one bit of the first bit sequence based on the data structure and known information.

Based on the data structure, which kind of data fields are contained in the first bit sequence may be known. As described above, some information contained in the first bit sequence may be already known to the receiver. For example, the first bit sequence contains the BSM, thus some positioning information together with some header data information of the transmitter may be known to the receiver. Therefore, at least one bit of the first bit sequence may be obtained based on the data structure and the known information.

In some embodiments, a second set of bits which correspond to the first set of bits may be obtained. In some embodiment, a register may be dedicated for obtaining the second set of bits. In some embodiments, the second set of bits may include bits representing first few digits of the positioning data of the receiver. The first few digits of the positioning data of the receiver and the transmitter may be the same. In some embodiments, the second set of bits may include bits representing the first few digits of the positioning data of the receiver, SNAP header data and LLC header data in a MAC layer of the receiver, or any combination thereof.

In S209, decoding the received signal frame based on the at least one bit using soft decision decoding.

In some embodiments, since the "SIGNAL" part of the signal frame is already obtained, S209 may include decoding the "DATA" part of the signal frame.

Figure 7:
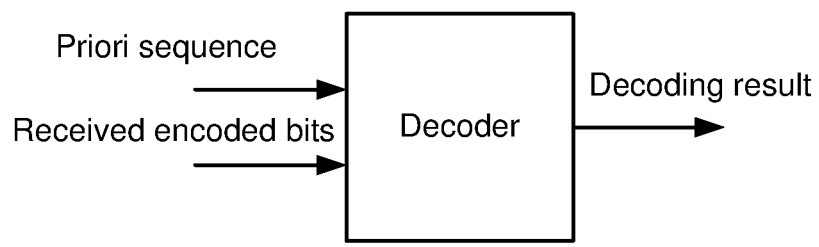
FIG. 7 is a diagram schematically illustrating a soft decision decoding process according to one embodiment.

FIG. 7 is a diagram schematically illustrating a soft decision decoding process which is commonly applied in WAVE systems. Referring to FIG. 7, a decoder, such as a soft output viterbi algorithm (SOVA) or a Bahl-Cocke-Helinek-Raviv algorithm (BCJR) decoder, may be input with priori sequence and received encoded bits, thereby obtaining a decoding result. The priori sequence may include N likelihood ratios, where N may equal to a number of bits included in the decoding result, which may be obtained based on the data structure. Each of the likelihood ratios may represent a probability value of a corresponding bit in the decoding result, where the probability value may represent whether the corresponding bit is like to be "0" or "1".

In some embodiments, a log likelihood ratio (LLR) sequence, which is a kind of priori sequence, may be formed based on the second set of bits. Specifically, each bit of the LLR sequence may represent a possibility of a corresponding bit in the first bit sequence being "1" or "0". The LLR sequence may be calculated based on Equation (1):

$$LLR(k) = \log \frac{P(xk = 1)}{P(xk = 0)}, \qquad \text{Equation (1)}$$

where LLR(k) stands for a LLR value corresponding to a $k^{th}$ bit in the first bit sequence, P(xk=1) stands for a probability of the $k^{th}$ bit being "1", and P(xk=0) stands for a probability of the $k^{th}$ bit being "0".

From Equation (1), it could be concluded as follows. When LLR(k) approaches "−∞", it may indicate most possibility of the $k^{th}$ bit being "1". When the LLR(k) approaches "−∞", it may indicate most possibility of the $k^{th}$ bit being "0". And when the LLR(k) equals to "0", it may indicate that the $k^{th}$ bit may have 50% chance of being "1" or "0".

Normally, the likelihood ratio values may be normalized into [0, 1], where "0" may correspond to "−∞" calculated based on Equation (1), "1" may correspond to "+∞" calculated based on Equation (1) and "0.5" may correspond to "0" calculated based on Equation (1), such that a bit "0" of the LLR sequence may represent a corresponding bit of the first bit sequence definitely being "0", and a bit "1" of the LLR sequence may represent a corresponding bit of the first bit sequence definitely being "1".

If the first bit sequence is completely unknown to the receiver, all LLRs in the LLR sequence may be set as "0.5". However, as described above, the at least one bit of the first bit sequence may be known to the receiver. Therefore, LLRs corresponding to the at least one bit may be set according to the at least one bit, which may improve decoding efficiency and accuracy.

In some embodiments, a first set of LLRs corresponding to the second set of bits may be set as "1" or "0" according to the second set of bits. The first set of LLRs correspond to the second set of bits may be distributed in the LLR sequence based on the data structure of the first bit sequence, since the second set of bits may correspond to the first set of bits.

The LLR sequence may be inputted into a soft output decoder together with the "DATA" part of the signal frame to obtain a decoding result. In the decoding result which is also a LLR sequence, LLRs other than the first set of LLRs may no longer be "0.5", but approach either "0" or "1". In some embodiments, at least one iteration may be used in the soft decision decoding process, such that the LLRs other than the first set of LLRs may be more close to either "0" or "1", which means whether a corresponding bit of the first bit sequence is "0" or "1" is more certain.

The decoding result may be checked based on the FCS. If the decoding result includes no error, the decoding result may be transmitted into layers higher than the physical layer of the receiver, and the BSM contained in the decoding result may be obtained and analyzed to estimate whether a dangerous driving state exists. If the decoding result is checked to include an error, the decoding result may also be transmitted into the higher layers, for example, an application layer. Threshold values may be set to pick up some bits having high probabilities of being "1" or "0", and these bits may be used in the application layer.

Figure 8:
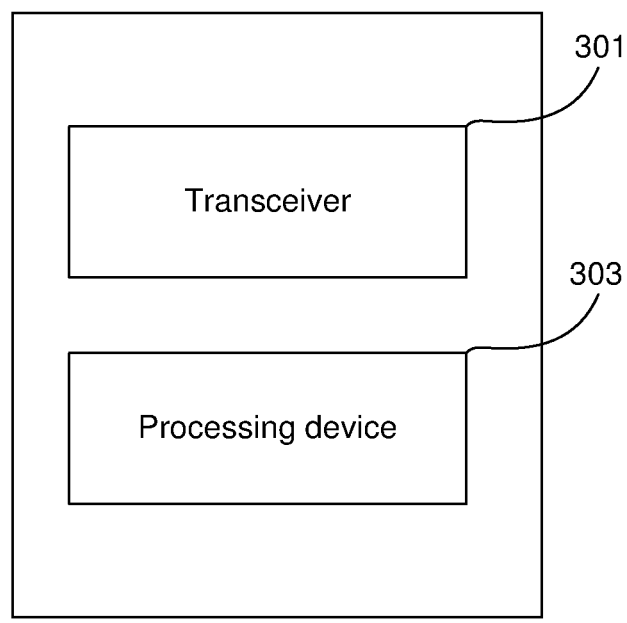
FIG. 8 schematically illustrates a block diagram of a soft decision decoding system in a receiver according to one embodiment.

According to one embodiment, a soft decision decoding system 300 is provided. The soft decision decoding system 300 may be disposed at a receiver side in a communication network. FIG. 8 schematically illustrates a block diagram of the soft decision decoding system 300.

Referring to FIG. 8, the soft decision decoding system 300 may include a transceiver 301 configured to receive a signal frame carrying a message through the communication network. The soft decision decoding system 300 may further include a processing device 303 configured to: obtain data structure of the message; obtain at least one bit of the message based on the data structure and known information; and decode the received signal frame based on the at least one bit using soft decision decoding.

Detail configurations of the processing device 303 may be obtained by referring detail descriptions in S203 to S209, which may not be illustrated in detail here.

There is little distinction left between hardware and software implementations of aspects of systems; the use of hardware or software is generally a design choice representing cost vs. efficiency tradeoffs. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A method for decoding data, comprising:
    receiving a first signal frame carrying a first message through a communication network;
    obtaining a first data structure associated with the first message from a plurality of different data structures;
    obtaining at least one bit of the first message based on the first data structure;
    decoding the received first signal frame based on the at least one bit of the first message using soft decision decoding to obtain a first decoding result;
    receiving a second signal frame carrying a second message through the communication network;
    obtaining a second data structure associated with the second message from the plurality of different data structures;
    obtaining at least one bit of the second message based on the second data structure; and
    decoding the received second signal frame based on the at least one bit of the second message using soft decision decoding to obtain a second decoding result.

2. The method according to claim 1, wherein the first data structure is obtained based on a length of the first signal frame.

3. The method according to claim 1, wherein the communication network is an IEEE 802.11p network, and obtaining the first data structure associated with the first message comprises:
    obtaining a physical layer convergence protocol (PLCP) header corresponding to the first message;
    determining a message type associated with the message based on control information associated with the first message contained in the PLCP header; and
    obtaining the first data structure associated with the first message based on the message type.

4. The method according to claim 3, wherein determining the message type comprises:
    determining that the PLCP header comprises information directly indicating the message type; and
    determining the message type based on the information directly indicating the message type.

5. The method according to claim 1, wherein, if the first data structure associated with the message indicates that the first message is a basic safety message (BSM), then the at least one bit of the first message comprises positioning data associated with a receiver.

6. The method according to claim 1, wherein, if the first data structure associated with the first message indicates that the first message is a BSM, then the at least one bit of the first message comprises at least one of bits representing positioning data associated with a of the receiver, sub-network access protocol (SNAP) header data, and logical link control (LLC) header date in a medium access control (MAC) layer of the receiver.

7. The method according to claim 1, wherein decoding the received first signal frame based on the at least one bit of the first message using soft decision decoding comprises:
generating an priori sequence that includes N likelihood ratios, wherein each likelihood ratio corresponds to one bit of the first message, and wherein likelihood ratios corresponding to the at least one bit of the first message are set according to the at least one bit of the first message; and
decoding the received first signal frame based on the priori sequence using soft decision decoding.

8. The method according to claim 7, wherein the priori sequence comprises a log likelihood ratio (LLR) sequence.

9. The method according to claim 1, further comprising transmitting the first decoding result to an application layer.

10. A soft decision decoding system implemented in a receiver, the system comprising:
a transceiver configured to:
receive a first signal frame carrying a first message through a communication network; and
receive a second signal frame carrying a second message through the communication network; and
a processing device configured to:
obtain a first data structure associated with the first message from a plurality of different data structures;
obtain at least one bit of the first message based on the first data structure;
decode the received first signal frame based on the at least one bit of the first message using soft decision decoding to obtain a first decoding result;
obtain a second data structure associated with the second message from the plurality of different data structures;
obtain at least one bit of the second message based on the second data structure; and
decode the received second signal frame based on the at least one bit of the second message using soft decision decoding to obtain a second decoding result.

11. The soft decision decoding system according to claim 10, wherein the processing device is configured to obtain the first data structure based on a length of the first signal frame.

12. The soft decision decoding system according to claim 10, wherein the processing device is configured to obtain the first data structure based on control information associated with the first message.

13. The soft decision decoding system according to claim 10, wherein the communication network is an IEEE 802.11p network, and the processing device is configured to obtain the first data structure by:

obtaining a physical layer convergence protocol (PLCP) header corresponding to the first message;
determining a message type associated with the first message based on control information associated with the first message contained in the PLCP header; and
obtaining the first data structure associated with the first message based on the message type.

14. The soft decision decoding system according to claim 13, wherein the processing device is configured to determine the message type by:
determining that the PLCP header comprises information directly indicating the message type; and
determining the message type based on the information directly indicating the message type.

15. The soft decision decoding system according to claim 10, wherein, if the first data structure associated with the first message indicates that the first message is a basic safety message (BSM), then the at least one bit of the first message comprises positioning data associated with a receiver.

16. The soft decision decoding system according to claim 10, wherein, if the first data structure associated with the first message indicates that the first message is a BSM, then the at least one bit of the first message comprises at least one of bits representing positioning data associated with a of the receiver, sub-network access protocol (SNAP) header data, and logical link control (LLC) header date in a medium access control (MAC) layer of the receiver.

17. The soft decision decoding system according to claim 10, wherein the processing device is configured to decode the first message based on a priori sequence that comprises N likelihood ratios, wherein each likelihood ratio corresponds to one bit of the first message, and wherein likelihood ratios corresponding to the at least one bit of the first message are set according to the at least one bit of the first message.

18. The soft decision decoding system according to claim 17, wherein the priori sequence comprises a log likelihood ratio (LLR) sequence.

19. The soft decision decoding system according to claim 10, wherein the processing device is configured to transmit the first decoding result to an application layer.

20. A method for decoding data, comprising:
receiving a signal frame carrying a message through a communication network;
obtaining data structure associated with the message from a plurality of different data structures, wherein the data structure is obtained based on control information associated with the message;
obtaining at least one bit of the message based on the data structure; and
decoding the received signal frame based on the at least one bit using soft decision decoding to obtain a decoding result.

* * * * *